United States Patent [19]

Ryden et al.

[11] Patent Number: 4,486,943

[45] Date of Patent: Dec. 11, 1984

[54] ZERO DRAIN OVERLAP AND SELF ALIGNED CONTACT METHOD FOR MOS DEVICES

[75] Inventors: William D. Ryden; Matthew V. Hanson; Gary F. Derbenwick; Alfred P. Gnadinger; James R. Adams, all of Colorado Springs, Colo.

[73] Assignee: Inmos Corporation, Colorado Springs, Colo.

[21] Appl. No.: 588,000

[22] Filed: Mar. 12, 1984

Related U.S. Application Data

[63] Continuation of Ser. No. 331,474, Dec. 16, 1981, abandoned.

[51] Int. Cl.$^3$ .......................................... H01L 21/265
[52] U.S. Cl. ................................ 29/571; 29/576 B; 29/578; 29/591; 148/1.5; 156/643; 357/23
[58] Field of Search ................. 29/571, 576 B, 577 C, 29/578, 589, 591; 148/1.5, 188; 156/643; 357/23 G, 23 S, 49, 51, 59

[56] References Cited

U.S. PATENT DOCUMENTS

| | | | |
|---|---|---|---|
| 3,472,712 | 10/1969 | Bower | 148/187 |
| 3,475,234 | 10/1969 | Kerwin et al. | 148/187 |
| 3,507,709 | 4/1970 | Bower | 148/187 X |
| 3,544,399 | 1/1970 | Dill | 29/571 X |
| 3,615,934 | 1/1971 | Bower | 148/176 |
| 3,849,216 | 11/1974 | Sauters | 148/187 |
| 3,976,511 | 8/1976 | Johnson | 148/187 X |
| 4,139,402 | 2/1979 | Steinmaier et al. | 29/571 X |
| 4,182,023 | 1/1980 | Cohen et al. | 29/571 |
| 4,234,362 | 11/1980 | Riseman | 29/578 X |
| 4,287,661 | 9/1981 | Stoffel | 29/571 |
| 4,356,623 | 11/1982 | Hunter | 29/576 B X |
| 4,400,866 | 8/1983 | Yeh et al. | 29/571 |

FOREIGN PATENT DOCUMENTS

| | | |
|---|---|---|
| 24125 | 2/1981 | European Pat. Off. . |
| 34508 | 8/1981 | European Pat. Off. . |
| 137657 | 10/1981 | Japan . |

OTHER PUBLICATIONS

Ho et al., "Si/SiO$_2$ Interface Oxidation Kinetics: A Physical Model for the Influence of High Substrate Doping Levels" in *J. Electrochem. Soc: Sol. State Science & Tech.*, 9-1979, pp. 1523-1530.

Sunami et al., "Intermediate Oxide Formation in Double-Polysilicon Gate MOS Structure" in *J. Electrochem. Soc.: Sol. State Sci. & Tech.*, 11-1980, pp. 2499-2505.

Kamins et al., "Oxidation of Phosphorous-Doped Low Pressure CVD Poly-Si Films" in *J. Electrochem. Soc.*, vol. 126, 5-1979, pp. 838-844.

Barnes et al., "Low Temperature Differential Oxidation for Double Polysilicon VLSI Devices" in *J. Electrochem. Soc.*, vol. 126, 10-1979, pp. 1779-1785.

Isaac et al., "Method for Fabricating a Self-Aligned Vertical PNP Transistor" in *IBM Technical Disclosure Bulletin*, vol. 22, pp. 3393-3396, 1-1980.

Primary Examiner—Brian E. Hearn
Assistant Examiner—Alan E. Schiavelli
Attorney, Agent, or Firm—Edward D. Manzo

[57] ABSTRACT

The invented technique permits the gate length to equal the channel length: source/drain regions are self-aligned and non-overlapping with respect to their gate electrode. The non-overlapping feature, along with other optimized device characteristics, are generally provided by defining a gate electrode over a substrate, forming an implant mask of dielectric, for example, on the sides of the gate electrode, and implanting a source/drain region such that the implant mask shields a portion of the substrate from implantation to provide a gap between a side edge of the gate electrode and the implanted regions. The source/drain region is then heat driven until its side edge is substantially aligned with the edge of the gate electrode. Self-aligned source/drain contacts are also provided using the implant mask to isolate the gate electrode from the contacts and interconnects.

18 Claims, 14 Drawing Figures

ZERO DRAIN OVERLAP AND SELF ALIGNED CONTACT METHOD FOR MOS DEVICES

This application is a continuation of Ser. No. 331,474, now abandoned, filed Dec. 16, 1981.

BACKGROUND OF THE INVENTION

This invention is directed generally to improvements in the fabrication of semiconductor devices. It is particularly directed to improved processing techniques for fabricating MOS (metal oxide semiconductor) transistors in a large scale integrated circuit.

An MOS transistor generally includes source/drain regions in a substrate, and a gate electrode formed above the substrate between the source/drain regions and separated from the substrate by a relatively thin dielectric. The relative alignment of the gate with its source/drain regions is an important factor which influences the performance of the transistor.

Conventional fabrication techniques usually cause edges of the source/drain regions to be initially substantially vertically aligned with the edges of their gate. In subsequent heat treatment steps, however, the source/drain regions diffuse laterally. This results in the edges of the gate overlapping the source/drain regions. Consequently, undesired gate-drain overlap and Miller capacitances are created, and the operating speed of the transistor is reduced.

In an attempt to avoid the foregoing problem, it has been proposed to establish a photoresist or dielectric layer on top of the gate such that the gate can be undercut to provide a photoresist or dielectric area which overhangs the edges of the gate. This overhang defines a source/drain implant area which laterally separates the source/drain implants from the nearby edges of the gate. However, the amount of the undercut is difficult to control. Consequently, alignment between the gate and the source/drain regions fluctuates substantially.

A related problem concerns the contacts for the source/drain regions. Except by imposing tight tolerances on the manner in which the contacts are patterned, it has been difficult to provide well aligned source/drain contacts which are well isolated from the gate electrode.

For the foregoing reasons, conventional fabrication techniques are not perfectly satisfactory for the construction of high speed, very large scale integrated circuitry, particularly where high packing density is a paramount concern.

OBJECTS OF THE INVENTION

It is a general object of the invention to provide an improved fabrication technique for MOS transistors.

It is a more specific object of the invention to provide a fabrication technique which results in MOS transistors having a well controlled and substantially reduced Miller capacitance and higher operating speeds.

It is a further object of the invention to provide a fabrication technique whereby source/drain contacts are more easily self-aligned with respect to their gate electrode.

SUMMARY OF THE INVENTION

According to the preferred embodiment of the present invention, a polysilicon gate is defined (on top of a gate oxide) above a substrate. Next, a differential thermal growth process establishes a dielectric layer of silicon dioxide over the intended source and drain regions and the sides and top of the gate. Because of the differential nature of thermal growth, the thickness of the oxide on the top and sides of the gate is greater than the thickness of grown oxide over the intended source and drain regions. These thicknesses are controlled. (Optionally, this step can be followed by anisotropic etching to thin the oxide over the source and drain regions). Next, in the preferred embodiment, the source and drain regions are implanted, using the oxide on the sides of the gate as an implant mask to provide a gap of a controlled width between the side wall of the resulting implants and the side walls of the polysilicon gate. Thereafter, the implants are heat driven to perfect alignment with the side walls of the gate to result in a zero overlap device. The oxide on the top and sides of the polysilicon gate is retained for use in the establishment of a contacting interconnect layer for the source and drain regions, where the remaining oxide ensures against shorting between those two interconnects. Other embodiments are described, some of which do not use the differential thermal growth.

BRIEF DESCRIPTION OF THE FIGURES

The objects stated above and other objects of the invention are set forth more particularly in the following detailed description of the accompanying drawings of which.

DESCRIPTION OF THE PREFERRED EMBODIMENT

A. Introduction

In the following description, a method is described for controlling the alignment of the source/drain regions of a typical MOS transistor with its polysilicon gate electrode, and for forming self-aligned source/drain contacts. Thereafter, alternate techniques are described for achieving the same result in applications where polysilicon or other gate materials are used, and which provide control over various other aspects of fabrication. As described more specifically below, the self-aligned source/drain regions are formed even into bare silicon, if desired, while simultaneously providing an isolating layer of dielectric, for example, on the gate of the transistor.

The way in which an exemplary MOS transistor is constructed with self-aligned source/drains to provide a reduced Miller capacitance and self-aligned contacts will now be described with reference to FIGS. 1–4. These figures illustrate the various stages of transistor construction which are effected by various steps in the method of fabrication.

B. Differential Thermal Growth (FIGS. 1 to 4)

Figure 1:
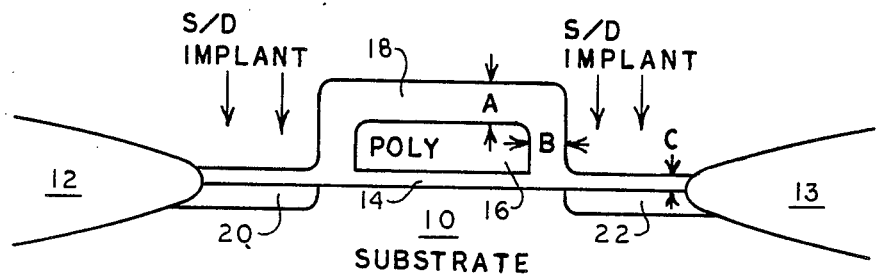
FIGS. 1-4 illustrate the sequential construction of an exemplary MOS transistor fabricated in accordance with the invention wherein differential dielectric growth rate is employed.

Referring first to FIG. 1, there is shown a substrate 10 and field oxide regions 12 and 13 which are formed in a conventional manner, such as by local oxidation. Between these field oxide regions, an MOS transistor is fabricated by first forming a gate oxide 14 in the usual manner. Next, a polysilicon layer, designated Poly and doped to a sheet resistance of about 20 ohms per square, is defined and etched using photoresist patterning techniques. This leaves a poly gate electrode 16 disposed above the transistor's intended channel.

A dielectric layer 18, of oxide, for example, is then established on the top and sides of the gate electrode 16 and over the substrate adjacent the gate electrode such that the oxide layer on the top and sides of the gate electrode is relatively thick compared to the oxide layer adjacent the gate electrode over the intended source/drain regions. This is preferably accomplished by steam oxidation at 850° C. until about 500 nanometers of the oxide 18 are provided over the top (dimension A) of the gate electrode. This step of differentially growing the oxide provides a substantially similar oxide thickness on the side (dimension B) of the gate electrode and a relatively thin oxide layer (dimension C) over the intended source/drain regions. This thickness of the oxide layer at C will typically be about 170 nanometers because the oxide grows faster over the top and sides of the doped gate electrode.

Irrespective of the specific dimensions of the oxide layer 18 and the way in which it is formed, the thickness of the oxide on the sides of the gate electrode (dimension B) is chosen so that later implanted sources and drains will be closely aligned with the vertical edges of the gate electrode 16 at the conclusion of transistor fabrication without any substantial gap or overlap between the source/drain regions and the gate electrode. That is, the oxide 18 on the sides of the gate electrode acts as an implant mask to shield underlying portions of the substrate from implantation.

Having established the oxide layer 18, source/drain regions 20 and 22 are implanted with arsenic or phosphorus, for example, to a depth which may be about 0.3 micron at a dose of about $6 \times 10^{15}$ ions per square centimeter. Because of the masking effect provided by the oxide on the sides of the gate electrode 16, the source/drain regions 20 and 22 are not implanted adjacent the vertical edges of the gate electrode. Rather, a gap is provided between the gate electrode 16 and the source/drain regions to allow for subsequent diffusion of the source/drain regions. FIG. 1 shows this stage of processing where source and drain 20 and 22 have been implanted but not yet diffused by heat treatment.

In some applications, it is desirable to increase the thickness (dimension A) of the layer 18 in order to provide improved isolation. Also, it may be desirable to independently control or reduce the thickness C such as to implant the source/drain regions through a thinner oxide or no oxide at all. In these cases, an anisotropic etch, such as the plasma etch described below, may be used to remove or thin the oxide layers which overlie the source/drain regions. By using an anisotropic etch, the sidewall oxides (dimension B) are not substantially thinned, wherefore the gap between the gate electrode and the implanted source/drain regions will remain illustratively is about 500 nanometers. However, it may be desirable to modify the anisotropy of the etch to controllably thin the oxide on the sidewall of the gate electrode to provide a smaller gap, 300 nanometers for example, where subsequent heat treatments are known to provide less lateral diffusion of the source/drain regions.

Figure 2:
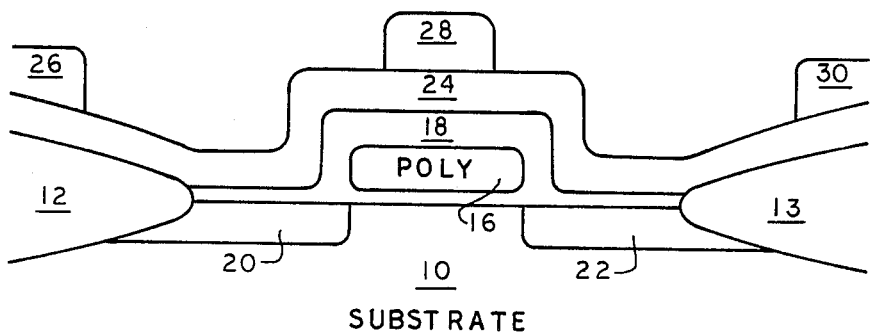
Figure 3:
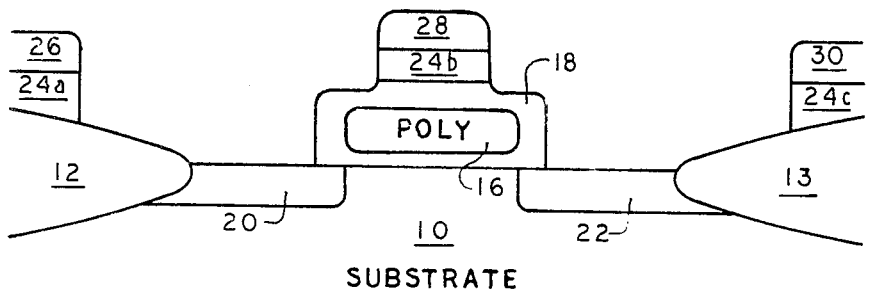

After the source/drain regions 20 and 22 have been implanted, standard processing occurs, including heat treating the structure. During such heat treatment, the implanted source/drain regions are driven deeper (to about 0.7 micron, for example) and driven laterally into substantial alignment with the vertical edges of the gate electrode (FIG. 2). Good alignment is achieved by establishing the thickness of the oxide layer 18 on the sides of the gate electrode so that the known heat treatments which follow cause the edges of the source/drain regions to be driven laterally by a distance which is substantially equal to dimension B.

After the heat treatment, an intermediate oxide layer 24 is deposited to a depth of about 500 nanometers, for example. As shown in FIG. 2, this intermediate oxide layer preferably covers the entire structure, including the field oxide regions 12 and 13.

Contact regions for the gate electrode and the source/drain regions are established by pattern-defining a photoresist layer at 26, 28 and 30. As shown, a contact region is thus formed between photoresists 26 and 28. This contact region overlaps the field oxide region 12 and the Poly gate electrode. A similar overlap is created in the area between photoresists 28 and 30.

Next, the oxide layers 18 and 24 are removed from the contact areas so that the substrate is exposed above the source/drain regions, preferably by using a plasma etch. The field oxide not masked by photoresist is also laid bare, and the unmasked oxide layer 18 which overlies the Poly gate may be thinned. Such a plasma etch may, for example, be carried out in a reactive plasma etcher capable of anisotropic etching. A parallel plate reactor with close spacing (about 2 centimeters) between the plates is effective using 50% $CHF_3$ and 50% $C_2F_6$ at a total pressure of about 700 millitorrs and a power of about 2000 watts.

At this point, it should be understood that the dielectric layers 18 and 24 may be made of either similar materials or different materials. It may be desired to use different materials to provide an etch stop which avoids thinning dielectric 18 over the gate electrode. For example, the dielectric 18 may be nitride and the dielectric 24 may be silicon dioxide. In that case, differential oxide growth cannot be utilized but one of the alternate methods described below may be used.

Where the dielectrics 18 and 24 are of a similar material such as silicon dioxide, a thin layer of another dielectric such as a nitride may be deposited on the dielectric 18 prior to forming the dielectric 24. This also prevents etching from removing the dielectric 18 while the dielectric 24 is being removed. In any case, a dielectric layer 18 will remain on the Poly gate 16 to facilitate the formation of self-aligned contacts or interconnects for the source/drain regions.

The directional etching described above provides the structure shown in FIG. 3 wherein an intermediate oxide layer 24a and a photoresist 26 are left over the illustrated portion of the field oxide 12. The illustrated portion of the field oxide 13 is covered by an intermediate oxide layer 24c and photoresist 30, and the central portion of the remaining oxide layer is covered by an intermediate oxide layer 24b and photoresist 28.

Figure 4:
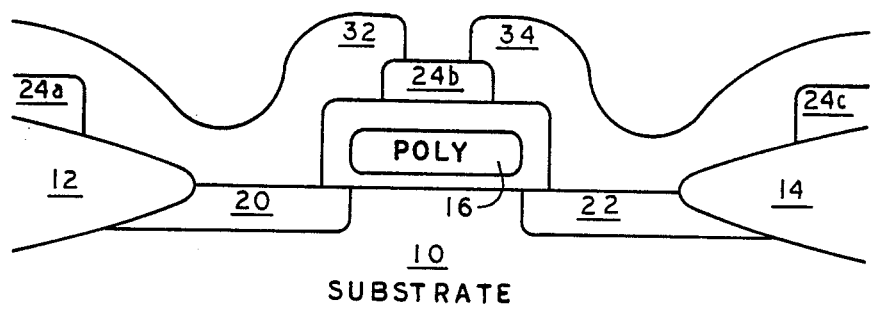

Referring now to FIG. 4, the photoresists are removed in a conventional manner and an interconnect contacting layer 32, 34, such as aluminum or polysilicon, is provided so that the interconnect 32 overlies the source/drain region 20 and overlaps both the Poly gate and the field oxide 12. Likewise, the interconnect 34 overlies the source/drain region 22 and overlaps both the Poly gate and the field oxide region 13. These interconnect patterns may be used to electrically contact the source/drain and gate regions in the usual manner.

Several advantages flow from the fabrication technique described above. Chief among these is the lack of undesired overlap between the finally processed source/drain regions and the Poly gate. Consequently, the transistor has reduced Miller capacitance and, therefore, operates faster. In addition, the width of the Poly gate is substantially equal to the transistor's electrical channel length. This allows transistors with longer channel characteristics to be fabricated with smaller physical dimensions.

Another significant advantage of this fabrication technique is that the source/drain contacts can be self-aligning. This result is obtained because this technique allows etching to the substrate over the source/drain regions while the oxide layer 18 protects the Poly gate. Even if the photoresist 28 is misaligned with respect to the gate 16, the oxide 18 prevents shorts to the gate when the interconnects 32, 34 are provided for the source/drain regions.

Figure 5:
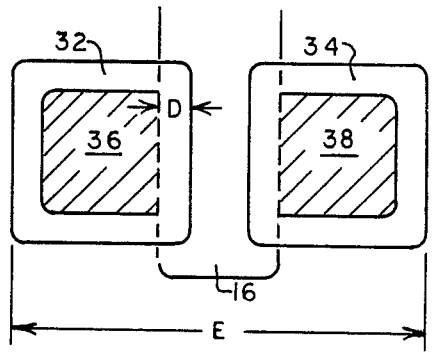
FIG. 5 is a simplified top view of the transistor which is fabricated as shown in FIGS. 1-4.

The manner in which the interconnects are provided also contributes substantially to a reduction in transistor size. As shown in the simplified top view depicted in FIG. 5, the interconnect patterns 32 and 34 overlap the Poly 16 while covering the active areas designated by the shaded regions 36 and 38. Typically, the Poly and the active areas are about 2 microns wide, and an overlap of about 0.5 microns (dimension D) exists between the interconnect patterns and the Poly. Consequently, the size (dimension E) of the transistor is reduced to about 7 microns or less.

Several alternatives are available for practicing the present fabrication technique. For example, the use of the intermediate oxide layer 24 may be eliminated, and contact areas may be defined by a non-selective etch. The resulting structure would be substantially as shown in FIG. 4, except that the intermediate oxide would not be present. This technique is useful in forming self-aligned buried contacts.

In addition, a nitrogen implant may be used prior to forming the oxide layer 18 (FIG. 1) to reduce the rate of oxidation over the source/drain regions while not affecting the rate of oxidation on Poly. During this nitrogen implantation, the gate electrode is protected from the implant by a photoresist layer. Source/drain implants may then be done after the oxide layer 18 is formed, and source/drain drive-in can be tailored to prevent overlap between the Poly gate electrode and the source/drain regions.

C. Alternative Techniques (FIGS. 6 to 14)

Figure 6:
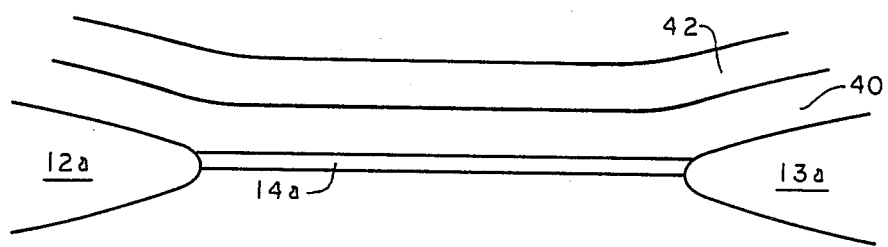
FIGS. 6-8 illustrate the construction of an exemplary MOS transistor employing an alternative method not requiring differential dielectric growth rate.
Figure 7:
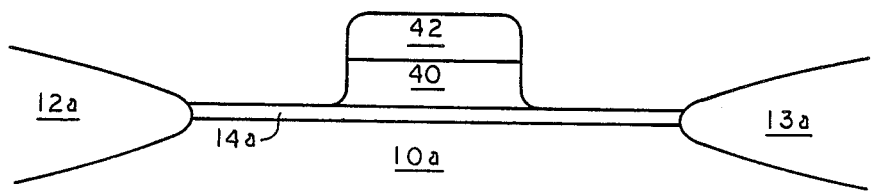
Figure 8:
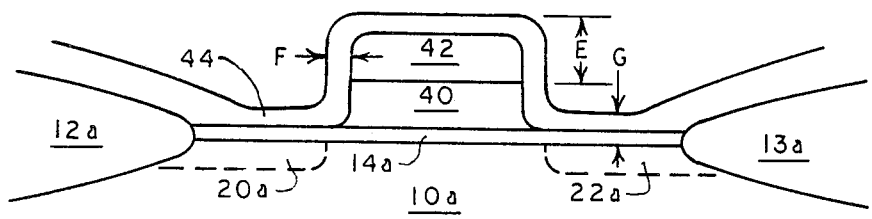

The method described with reference to FIGS. 1-4 utilizes the differential growth rate of dielectric over the gate electrode and over the source/drain regions to provide self-aligned, non-overlapping source/drain regions. There are circumstances, however, where such differential rate of dielectric growth is difficult or impractical to obtain, such as when the gate electrode is made of a silicide or some other materials. In these cases, and in other situations where it is not desired to employ differential oxide growth, an alternative technique may be used to provide the structure shown in FIG. 1 for fabricating properly aligned source/drain regions. One such alternative is depicted in FIGS. 6-8. In these and the remaining figures, materials and structure which correspond to the materials and structure of FIGS. 1-4 have corresponding reference numerals followed by an alpha character.

Referring to FIG. 6, field oxide regions 12a and 13a and a dielectric layer 14a are established in any conventional manner. Then a layer of gate electrode material such as silicide, polysilicon, or other suitable material is formed over the dielectric 14a. Over the gate material 40, a dielectric 42 is formed of silicon dioxide or nitride, for example. If an oxide is selected, it may be either deposited or grown, but growing is preferred for better oxide integrity.

Using conventional patterning techniques, portions of the layers 40 and 42 are selectively removed to provide the structure depicted in FIG. 7. As shown, a gate electrode 40 is covered on its top by the dielectric 42.

Referring to FIG. 8, another dielectric 44 such as silicon dioxide is established over the dielectrics 42 and 14a and the field oxide regions. Consequently, this provides a composite dielectric having a thickness E over the gate electrode 40, a thickness F on the sidewalls of the gate electrode, and a thickness G over the intended source/drain regions. The thickness of the dielectric 44 on the sides of the gate electrode (dimension F) acts as an implant mask and is chosen so that later implanted sources and drains will be closely aligned with the vertical edges of the gate electrode 40 at the conclusion of transistor fabrication without any substantial gap or overlap between the source/drain regions and the gate electrode.

The structure shown in FIG. 8 may then be dry etched, as by the previously described plasma etch, to thin or even remove the dielectric 44 where it overlies the dielectric 42 and the intended source/drain regions 20a and 22a. This will essentially result in the structure shown in FIG. 1. Implantation of the source/drain regions, and the subsequent processing and heat treatment described with reference to FIGS. 1-4 is then effected. The source/drain regions 20a and 22a will, of course, diffuse such that their edges are driven into substantial vertical alignment with the corresponding vertical edges of the gate electrode 40. Self-aligned interconnects for the source/drain regions are also provided by this alternate method.

Figure 9:
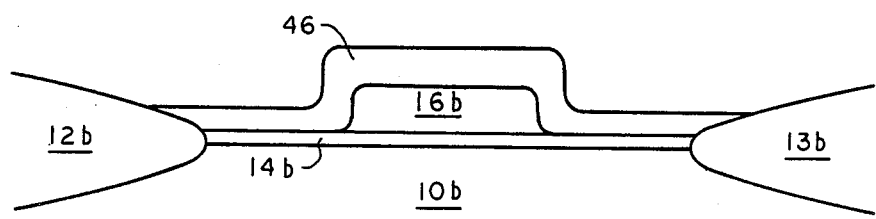
FIGS. 9 and 10 illustrate how an MOS transistor is alternatively constructed with an implant mask comprising dielectric remnants.
Figure 10:
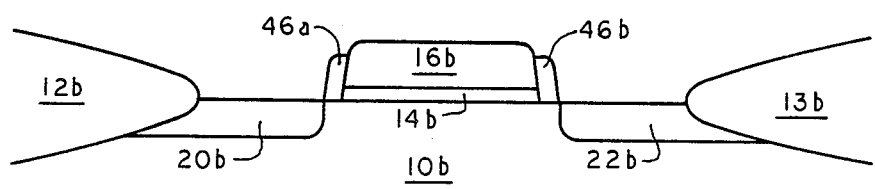

Referring to FIGS. 9 and 10, another method of forming properly aligned source/drain regions may be used when it is desired to dope a polysilicon gate at the same time the source/drains are doped. This alternate method includes establishing a dielectric 14b (FIG. 9) over the substrate and defining a polysilicon gate 16b over the dielectric 14b. Another dielectric 46, such as silicon dioxide, is then deposited (or grown) over the entire structure. Then the dielectric 46 is anisotropically etched, as by the previously described plasma etch, to expose the bare silicon substrate and the top of the gate electrode 16b as shown in FIG. 10. Because of this unidirectional etch, remnants 46a and 46b of the dielectric are left on the sides of the gate electrode to mask the implantation of the source/drain regions 20b and 22b.

The gate electrode 16b may now be doped at the same time that the source/drain regions are implanted.

Comparing FIGS. 1 and 10, it can be seen that similar structures are provided except that the gate 16b (FIG. 10) is not covered by dielectric. Subsequent fabrication steps are similar to those described previously for heat driving the source/drain regions into alignment with the vertical edges of the gate electrode 16b and for establishing the self-aligned contacts.

Figure 11:
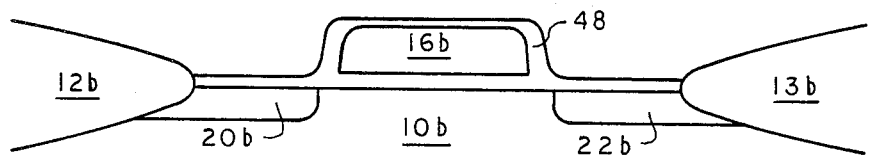
FIG. 11 illustrates a variation on the method shown in FIGS. 9 and 10.

It is sometimes preferred to leave a thin layer of oxide over the source/drain regions 20b and 22b during implantation. This variant is shown in FIG. 11 in which an oxide layer 48, having a thickness typically less than 100 nanometers, is grown or deposited over the gate 16b, over the remnants 46a and 46b (not shown separately in FIG. 11), and over the substrate. Source/drain regions 20b and 22b may then be implanted through the oxide layer 48 while the gate electrode 16b is simultaneously doped.

Figure 12:
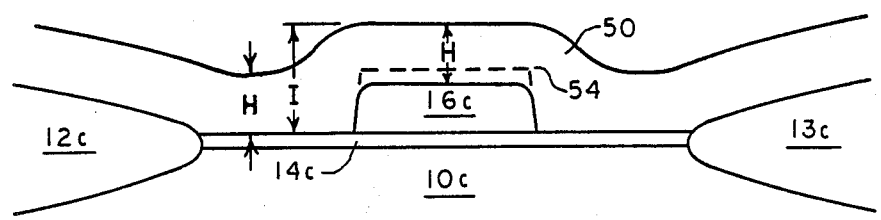
FIGS. 12 and 13 illustrate how an MOS transistor is fabricated with an implant mask comprising photoresist remnants.

The remnants on the sides of the gate electrode, as shown in FIG. 10, may be formed of material other than dielectric. One such material is photoresist, and it may be utilized as described in connection with FIGS. 12 and 13. Referring first to FIG. 12, a dielectric 14c is established over the substrate 10c in the usual manner, and a gate electrode 16c of polysilicon, for example, is defined over the intended channel of the transistor. A layer of photoresist material 50 is then conformally established in a conventional manner over the entire structure. This results in a layer of photoresist having a depth H over the intended source/drain regions and over the gate electrode 16c. A greater depth I of photoresist occurs in the areas adjacent the sides of the gate electrode.

The photoresist is then exposed and developed conventionally or anisotropically etched so as to remove a thickness H of it. Because of the greater depth of the photoresist at the areas adjacent the gate electrode, photoresist remnants or fillets 50a and 50b (FIG. 13) remain on the sides of the gate electrode. These fillets serve, of course, to mask the source/drain implantation as described in the other examples.

The source/drain regions 20c and 22c may now be implanted. Because the gate electrode 16 is uncovered, this implantation also dopes the gate electrode.

Figure 13:
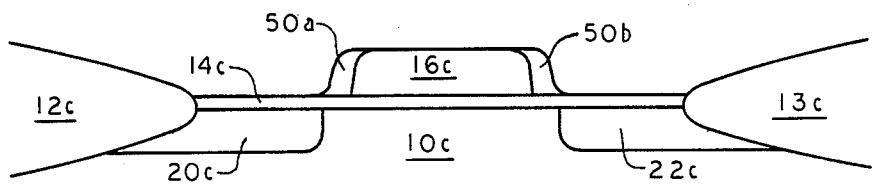
Figure 14:
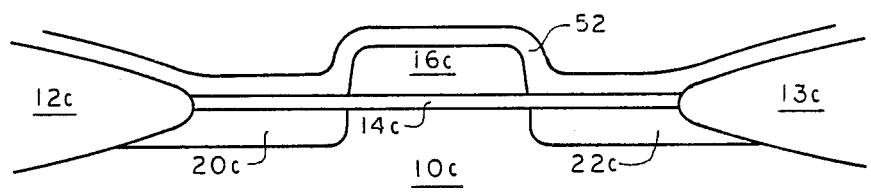
FIG. 14 shows a variation on the method depicted in FIGS. 12 and 13.

After the structure shown in FIG. 13 has been obtained, the photoresist fillets 50a and 50b are stripped conventionally. Then an oxide layer 52 (FIG. 14) may be established over the entire structure. Preferably, about 50 nanometers of the oxide 52 are grown thermally and the remainder is deposited. Next, the previously described processing occurs, including the heat treatment which drives the source/drain regions 20c and 22c into the depicted non-overlapping alignment with the vertical edges of the gate electrode 16c.

When it is not desired to dope the gate electrode during source/drain implant, a layer of oxide may be deposited over the gate material prior to the application of the photoresist, such as shown in FIG. 6. Processing then continues as described in connection with FIGS. 6 and 7 to develop an oxide layer over the defined gate electrode. The photoresist may then be applied and selectively removed as previously described, with the result that an oxide layer 54 (FIG. 12) separates the photoresist from the top of the gate electrode. This oxide layer prevents the gate material from being doped during source/drain implantation.

D. Conclusion

Although various methods have been described for fabricating an MOS device, all such methods provide an implant mask which ensures that the source/drain regions are properly aligned with the gate electrode at the conclusion of fabrication. In addition, the implant mask serves to isolate the gate electrode, particularly its edges, from interconnects so that the patterns which define the interconnects need not be held to tight tolerances.

It will be obvious to those skilled in the art that many alterations and modifications may be made to the described method without departing from the invention. By way of example only, the sequence in which some of the steps are practiced may be altered to suit a particular application or processing environment. Many other such changes will be obvious to those skilled in the art. Accordingly, it is intended that all such modifications and alterations be considered as within the spirit and scope of the invention as defined by the appended claims.

What is claimed is:

1. A method of fabricating on a substrate an MOS transistor having a gate electrode and a self-aligned source/drain region with zero overlap comprising:
   (a) forming a doped polysilicon gate electrode upon but insulated from the substrate; then
   (b) differentially thermally growing an oxide to serve as an implant mask having controlled thickness on both the top and sides of the gate electrode whereby a relatively thicker layer of oxide is developed on the top and sides of the gate electrode and a relatively thinner layer of oxide is developed on the intended source and drain regions of the substrate; then
   (c) anisotropically etching said oxide;
   (d) implanting a source/drain region in the substrate such that said implant mask shields an underlying portion of the substrate from implantation to result in a gap between a side edge of the gate electrode and a side edge of the implanted region; and then
   (e) heat driving the implanted source/drain region until its side edge is substantially aligned with the previously separated side edge of the gate electrode, whereby the source/drain edge is aligned with the gate electrode edge and there is substantially zero overlap.

2. A method as set forth in claim 1 wherein said oxide is grown in steam at a temperature of about 850 degrees centigrade.

3. A method as set forth in claim 2 wherein the source/drain region is implanted through the relatively thin oxide layer over the substrate.

4. A method as set forth in claim 1 wherein said step of anisotropically etching removes said oxide over the intended source/drain region and yet leaves masking oxide remaining on the top and sides of the gate electrode.

5. A method as set forth in claim 1 further including the steps of:
   after said implanting step, forming an intermediate dielectric over both the gate electrode and the source/drain region;
   patterning a contact area over the source/drain region to overlie the source/drain region and overlap the oxide on the gate electrode;

etching the dielectric material in the contact area down to the substrate while leaving the oxide on the top and sides of the gate electrode; and providing a conductive material in the etched contact area to provide a contact for the source/drain region, whereby a self-aligned contact is formed such that the gate electrode is prohibited by the oxide over the gate electrode from being shorted in the event the patterned contact area is misaligned.

6. A method of fabricating on a substrate an MOS transistor having a gate electrode and a self-aligned source/drain region comprising:
   (a) forming a doped polysilicon gate electrode insulated from the substrate;
   (b) growing a dielectric layer over the gate electrode by a process controlled to develop a high differential of dielectric thickness such that the dielectric is relatively thick over the top and sides of the gate electrode and relatively thinner over the intended source/drain regions;
   (c) anisotropically etching said dielectric layer;
   (d) implanting the source/drain region such that its edge is laterally offset from the substrate area below the gate electrode due to said dielectric layer being present on the sides of the gate electrode;
   (e) heat driving the source/drain region laterally until its edge is substantially vertically aligned with the side of the gate electrode;
   (f) etching contact area to expose a part of the source/drain region and yet maintaining the dielectric on the top and sides of the gate electrode; and
   (g) forming a conductive contact in the etched area, wherein the source/drain region is properly aligned with the gate electrode and the conductive contact is aligned with the source/drain region without shorting the gate electrode.

7. The method according to claim 6 wherein the gate is highly doped polysilicon and the dielectric is silicon oxide differentially thermally grown in a steam atmosphere at a temperature which promotes a differential in the oxide growth rates thereby to form simultaneously over the top and sides of the polysilicon gate a single oxide on the sides and top of the gate thereon for use as an implant mask and for isolation of the gate from other elements to be formed or added to the MOS transistor.

8. The method of claim 7 wherein said anisotropically etching step reduces the thickness of oxide covering the intended source and drain regions but leaves sufficient grown oxide on the top and sides of said gate electrode for use as an implant mask in said subsequent implanting step.

9. A method as set forth in claim 6 wherein the method includes:
   after said implanting step, forming an intermediate dielectric over both the gate electrode and the source/drain region;
   patterning a contact area over the source/drain region to overlie the source/drain region and overlap the dielectric on the gate electrode; etching in the contact area down to the substrate while leaving the dielectric the top and sides of the gate electrode; and
   providing a conductive material in the etched contact area to provide a contact for the source/drain region, whereby a self-aligned contact is formed such that the gate electrode is prohibited by the dielectric over the gate electrode from being shorted in the event the patterned contact area is misaligned.

10. A method of fabricating a self-aligned semiconductor device having a gate, a source, and a drain with zero overlap comprising:
    (a) forming a defined gate electrode insulated from and over a substrate, said gate electrode being polysilicon which is doped to promote a high rate of differential thermal oxidation, said substrate being monocrystalline silicon; then
    (b) establishing an isolating oxide layer on the top and sides of said gate electrode by thermal oxidation under ambient conditions controlled such that the oxide layer covers the top and sides of the gate electrode and regions in the substrate where the source and drain will be formed, the oxide growing substantially thicker on the top and sides of the gate electrode than above the prospective source and drain; then
    (c) anisotropically etching the device to reduce the oxide thickness over the source and drain regions but to leave oxide on the top and sides of the gate electrode suitable for masking purposes; then
    (d) applying source and drain implants adjacent to the gate electrode, while using said oxide on the gate as a shield so that the source and drain implants will initially be laterally separated from the gate by a predetermined, controlled distance;
    (e) heat driving said implants laterally until the side edges thereof align with side edges of said gate electrode for substantially zero overlap; and
    (f) retaining said isolating oxide on the top and sides of said gate electrode.

11. The method of claim 10 further comprising establishing first and second interconnects contacting said source and drain, each being electrically distinct and each contacting respective portions of said isolating oxide.

12. The method of claim 10 further comprising:
    applying an intermediate dielectric layer after said source and drain implants are applied, said intermediate layer covering said isolating oxide layer and said implants; then
    patterning a photoresist on said intermediate layer and above said gate; then
    etching to expose the source and drain while leaving the gate covered on its top and sides by said isolating oxide, and while leaving the portion of said intermediate layer masked by said photoresist; then
    removing said photoresist to leave an isolated gate having a remaining portion of said intermediate layer above said gate;
    establishing a first interconnect contacting said source and said isolating oxide over said gate and establishing a second interconnect contacting said drain and said isolating oxide over said gate.

13. The method of claim 10 wherein said gate is formed of polysilicon doped to a sheet resistance of about 20 ohms per square.

14. A method as set forth in claim 10:
    after said implanting step, forming an intermediate dielectric over both the gate electrode and the source/drain region;
    patterning a contact area over the source/drain region to overlie the source/drain region and overlap the oxide on the gate electrode;

etching the dielectric material in the contact area down to the substrate while leaving the oxide on the top and sides of the gate electrode; and providing a conductive material in the etched contact area to provide a contact for the source/drain region, whereby a self-aligned contact is formed such that the gate electrode is prohibited by the oxide over the gate electrode from being shorted in the event the patterned contact area is misaligned.

15. A method of fabricating on a substrate an MOS transistor having a gate electrode and a self-aligned source/drain region with zero drain overlap comprising:

forming a doped gate electrode insulated from the substrate, said substrate being monocrystalline silicon; then establishing an isolating oxide on the top and sides of the gate electrode and over the substrate adjacent the gate electrode such that the oxide on the top and sides of the gate electrode is relatively thick compared to the oxide over the substrate, including oxidizing in a steam atmosphere at a temperature which promotes high differential rates of growth of oxide as between the doped poly gate electrode and the substrate;

anisotropically etching the oxide at the top of the gate electrode and the intended source/drain region to leave oxide on at least the sides of the gate electrode;

implanting a source/drain region in the substrate so that the oxide on the sides of the gate shield the underlying portion of the substrate from implantation thereby to provide a gap between a side edge of the gate electrode and side edge of the implanted region; then heat driving said implanted source/drain region so that its side edge can be substantially aligned with the previously separated side edge of the gate electrode and no substantial gap or overlap exists between the source/drain region and the gate electrode.

16. A method as set forth in claim 15 wherein the source/drain region is implanted while the top of the gate electrode is substantially free of dielectric for doping the gate electrode during source/drain implantation.

17. A method as set forth in claim 15 wherein a relatively thin oxide is formed over the gate electrode, the dielectric remnants and the intended source/drain region prior to implantation.

18. A method according to claim 15 including the steps of:

after said implanting step, forming an intermediate dielectric over both the gate electrode and the source/drain region;

patterning a contact area over the source/drain region to overlie the source/drain region and overlap the oxide on the gate electrode;

etching the dielectric material in the contact area down to the substrate while leaving the oxide on the top and sides of the gate electrode; and providing a conductive material in the etched contact area to provide a contact for the source/drain region, whereby a self-aligned contact is formed such that the gate electrode is prohibited by the oxide over the gate electrode from being shorted in the event the patterned contact area is misaligned.

* * * * *